United States Patent
Nagano et al.

(10) Patent No.: US 9,011,726 B2
(45) Date of Patent: Apr. 21, 2015

(54) ELECTRICALLY CONDUCTIVE POWDER AND PRODUCTION THEREOF, PASTE OF ELECTRICALLY CONDUCTIVE POWDER AND PRODUCTION OF PASTE OF ELECTRICALLY CONDUCTIVE POWDER

(75) Inventors: Toyoji Nagano, Tokyo (JP); Kinji Oono, Fujisawa (JP); Shoko Kuwajima, Hitachinaka (JP)

(73) Assignee: Alpha Scientific, Corporation, Tokyo (JP)

( * ) Notice: Subject to any disclaimer, the term of this patent is extended or adjusted under 35 U.S.C. 154(b) by 987 days.

(21) Appl. No.: 12/067,996

(22) PCT Filed: Sep. 29, 2006

(86) PCT No.: PCT/JP2006/319592
§ 371 (c)(1),
(2), (4) Date: Mar. 25, 2008

(87) PCT Pub. No.: WO2007/037440
PCT Pub. Date: Apr. 5, 2007

(65) Prior Publication Data
US 2009/0127518 A1      May 21, 2009

(30) Foreign Application Priority Data

Sep. 29, 2005   (JP) ................. 2005-285211
Sep. 6, 2006    (JP) ................. 2006-242032

(51) Int. Cl.
 *H01B 1/00*    (2006.01)
 *H01B 1/22*    (2006.01)
 *H05K 1/09*    (2006.01)

(52) U.S. Cl.
CPC .................. *H01B 1/22* (2013.01); *H05K 1/095* (2013.01); *H05K 2201/0245* (2013.01); *H05K 2201/0272* (2013.01)

(58) Field of Classification Search
USPC ......................................... 252/500, 512, 514
See application file for complete search history.

(56) References Cited

U.S. PATENT DOCUMENTS

| | | | |
|---|---|---|---|
| 2004/0127626 A1* | 7/2004 | Yoshiko et al. | ............... 524/440 |
| 2006/0145125 A1 | 7/2006 | Kuwajima et al. | |
| 2007/0164260 A1 | 7/2007 | Kuwajima | |

FOREIGN PATENT DOCUMENTS

| | | |
|---|---|---|
| JP | 4214774 A | 8/1992 |
| JP | 10163583 A | 6/1998 |
| JP | 2002008444 A | 1/2002 |
| JP | 2003141929 A | 5/2003 |
| JP | 2004027246 A | 1/2004 |
| JP | 2005082632 A | 3/2005 |
| WO | 2004068506 A1 | 8/2004 |
| WO | 2005031760 A1 | 4/2005 |
| WO | 2005041213 A1 | 5/2005 |

OTHER PUBLICATIONS

Huntai-Kougaku Binran (Powder Technology Handbook), 1st ed., Feb. issue, Showa 61 (1986), pp. 104-109, edited by The Society of Powder Technology, Japan, published from the Nikken Kogyo Shinbun, Ltd., (6 pp.) and English translation (6 pp.).

* cited by examiner

*Primary Examiner* — Monique Peets
(74) *Attorney, Agent, or Firm* — The Webb Law Firm

(57) ABSTRACT

Electrically conductive powder includes polyhedral large particles and flakey small particles. The aspect ratio of the small particles is not less than 3 and is at least 1.3 times greater than that of the large particles. The electrically conductive powder is surface treated with a fatty acid. The electrically conductive powder has good contact among the polyhedral large particles and the flakey small particles. An electrically conductive paste of the electrically conductive powder achieves excellent electrical and thermal conductivities because the particles are in contact not at points but through surfaces. The electrically conductive paste is capable of filling via-holes in a satisfactory manner.

14 Claims, 5 Drawing Sheets

5 μm

5 μm

5 μm

5 μm

5 μm

ELECTRICALLY CONDUCTIVE POWDER AND PRODUCTION THEREOF, PASTE OF ELECTRICALLY CONDUCTIVE POWDER AND PRODUCTION OF PASTE OF ELECTRICALLY CONDUCTIVE POWDER

TECHNICAL FIELD

The present invention relates to electrically conductive powder for use in electrically conductive or thermally conductive pastes, a production process thereof, a paste of electrically conductive powder and a process for producing the paste of electrically conductive powder.

BACKGROUND OF THE INVENTION

Conventionally electrically conductive powder used for electrically and thermally conductive pastes is a mixture of large and small, spherical or substantially spherical particles for high-density packing (Nonpatent Document 1). In the fields where high electrical or thermal conductivity is required, electrically conductive powders such as of gold, silver, copper, aluminum, palladium and alloys of these metals are used. The electrical or thermal conductivity is improved by increasing the amount of the electrically conductive powder. (Nonpatent Document 1: FUNTAI KOUGAKU BINRAN (POWDER TECHNOLOGY HANDBOOK), first copy of the first edition, February issue, Showa 61 (1986), pp. 101-107, edited by The Society of Powder Technology, Japan, published from THE NIKKAN KOGYO SHIMBUN, LTD.)

Nonpatent Document 1 describes that electrically conductive powder for high-density packing is prepared by mixing spherical particles of various sizes. Nonpatent Document 1 discloses that the spherical particles are regularly arranged and small spherical particles are packed in spacing, whereby a packing density of at least 80% is theoretically accomplished. However, this is not always the case for the following reasons. Commercially available spherical silver powder contains partially agglomerated particles. Silver powder having particle diameters of 3 to 20 µm achieves a relative packing density of about 60%, and silver powder with particle diameters around 1 µm has a relative packing density as high as only 50%. Even if these powders are mixed together, the relative packing density is only about 60%.

Electrical contact between circuits of a multilayer circuit board is established by filling through-holes with an electrically conductive packing paste. In order to obtain high electric conductivities, it is necessary that as much as possible of the electrically conductive paste is filled in the through-holes and the electrically conductive powder fills the holes without spacing. Because of this requirement, the conventional electrically conductive packing pastes used in such field are required to contain a large amount of electrically conductive powder. However, increasing a contact of the electrically conductive powder results in high viscosity of the electrically conductive paste, and the paste will not geed-fill through-holes, well. The viscosity is reduced by increasing the binder content in the electrically conductive paste, and such paste will easily fill through-holes. However, electric conductivities are deteriorated at the same time.

When a conventional electrically conductive paste is used as a thermally conductive adhesive, thermal conductivity of the adhesive is deteriorated even when the electrically conductive powder consists of spherical particles, irrespective of the packing density of the electrically conductive powder.

Because electrically conductive spherical particles contact each other or contact surfaces at only points, the contact efficiency is bad. Even if substantially flaky particles are used in order to improve the contact efficiency, the paste viscosity will also increase, and the paste does not fill via-holes in a circuit board sufficiently. Moreover, when the paste is filled in the via-holes, the electrically conductive flaky particles tend to be oriented by the paste's viscous behavior so that the major surface of the flaky particles is perpendicular to the Z axis (conductive direction) of the via-holes. Consequently, electrical and thermal conductivities in the Z axis direction are much lower than expected.

The electrically conductive spherical particles have another problem. When a layer of the particles is pushed down with a press or the like, the particles are isotropically pressed and easily slide on one another. As a result, a packing volume of them deteriorates, and the electrically conductive particles are difficult to press strongly each other.

The conventional electrically conductive pastes containing electrically conductive powder are used as electrically conductive adhesives. If the electrically conductive adhesive has low thixotropic properties, the paste will be stringy and easily blot the electrically conductive adhesive may attach to undesired next portions.

The use of fine electrically conductive particles and fine electrically conductive flaky particles in combination will increase the thixotropic properties of the electrically conductive adhesive. However, because the fine particles are agglomerated, an electrically conductive adhesive paste containing such particles has high viscosity and does not fill holes enough. In a paste prepared using an electrically conductive mixed powder with a low relative packing density, when increasing the electrically conductive mixed powder, it is difficult to produce a paste because the obtained mixture has very high viscosity.

SUMMARY OF THE INVENTION

The present inventors diligently studied in order to solve the above problems. The inventors have completed the present invention with the following:

[1] Electrically conductive powder which is substantially disagglomerated electrical conductive powder, comprising polyhedral particles and substantially flaky particles, wherein, small particles being less in size than a particle size for which 30% of the total particles are smaller have an average aspect ratio of not less than 3, the average aspect ratio of the small particles is at least 1.3 times greater than that of large particles being not less in size than a particle size for which 30% of the total particles are smaller, the substantially disagglomerated electrically conductive powder is surface treated with not more than 0.5 wt % of a fatty acid based on the weight of the electrically conductive powder.

[2] The electrically conductive powder of [1], wherein the electrically conductive powder further comprises easily-dispersible fine silver particles that have an average particle diameter of not more than 2.5 µm, and the weight ratio of the electrically conductive powder and the easily-dispersible fine silver particles is in the range of 95:5 to 55:45.

[3] The electrically conductive powder of [2], wherein the electrically conductive powder further comprises agglomerated ultra fine silver particles, the ultra fine silver particles in the agglomerated particles have an average primary particle diameter of not more than 0.3 µm, and the weight ratio of the electrically conductive powder, the easily-dispersible fine silver particles and the ultra fine silver particles is in the range of 94.525:4.975:0.5 to 52.25:42.75:5.00.

[4] The electrically conductive powder of [1], wherein the substantially disagglomerated electrically conductive powder comprises silver or a silver alloy, or copper or a copper alloy coated with silver, and when the substantially disagglomerated electrically conductive powder comprises copper or a copper alloy coated with silver, the weight ratio of copper and silver (copper:silver) is in the range of 95:5 to 65:35.

[5] The electrically conductive powder of [1] to [4], wherein the press density is in the range of 80 to 99%.

[6] A paste of electrically conductive powder comprising the electrically conductive powder of [1] to [5] and a binder, wherein the binder content is in the range of 0.3 to 7 wt % of the total weight of a solid in the binder and the electrically conductive powder.

[7] A process for producing the electrically conductive powder of [1], comprising placing starting electrically conductive powder and fine beads into a container, and allowing the starting electrically conductive powder and the beads to flow by moving the container to disagglomerate and shape-transform the starting electrically conductive powder into polyhedral particles and substantially flakey particles.

[8] The process of [7], wherein the starting electrically conductive powder comprises silver or a silver alloy.

[9] A process for producing a paste of electrically conductive powder, comprising dispersing agglomerated ultra fine silver particles and easily-dispersible fine silver particles in a binder solution to prepare a slurry, applying shear force to the slurry to disagglomerate the agglomerated ultra fine silver particles and the easily-dispersible fine silver particles, and uniformly admixing the electrically conductive powder of [1].

The electrically conductive powder of the present invention comprises large polyhedral particles and substantially flaky particles, and small polyhedral particles and substantially flaky particles. Because of these shapes and various sizes, the particles closely contact each other and efficiently contact surfaces of the substrate. The paste of the invention can be good filled between surfaces or in through-holes to provide electrical and thermal conductivities. According to the invention, surfaces are connected with each other through a small number of particles in the paste, and therefore the contact face becomes large and number of which the particles connect each other becomes low. Since contacts between particles increase electrical or thermal resistance, the facts that the number of surface contacts is small and that the particles contact each other via surfaces not via points on the particles are very advantageous for high electrical conductivity and thermal conductivity.

In particular, when the electrically conductive powder includes large and small copper particles that are surface-coated with silver, silver in the outermost layer and copper form an alloy layer which prevents copper from oxidation. Consequently, the prevention of silver migration (anti-migration properties) is drastically improved.

The electrically conductive powder may be produced by placing starting electrically conductive powder and fine beads into a container, and allowing the electrically conductive powder and the beads to flow by moving the container to disagglomerate the starting electrically conductive powder. As a result, the starting powder is formed into polyhedral particles and substantially flakey particles. The electrically conductive powder is easily formed into a paste, and the paste has excellent printing properties, shows good application properties in use as an adhesive and easily fills via-holes enough. Furthermore, obtained products have excellent electrical and thermal conductivities. Moreover the paste according to the present invention has superior anti-migration properties. That is, the paste according to the present invention has superior workability.

According to the present invention, large and small particles having different average aspect ratios are produced from the starting electrically conductive powder at the same time in one treatment. The present invention does not require an intricate procedure of separately producing large and small particles and mixing them. Conventionally, when particles are so small that production is difficult, the small particles are prepared by classifying from the particles having various size and collecting small particles, but the present invention does not involve such classification.

DETAILED DESCRIPTION OF THE INVENTION

Figure 1:
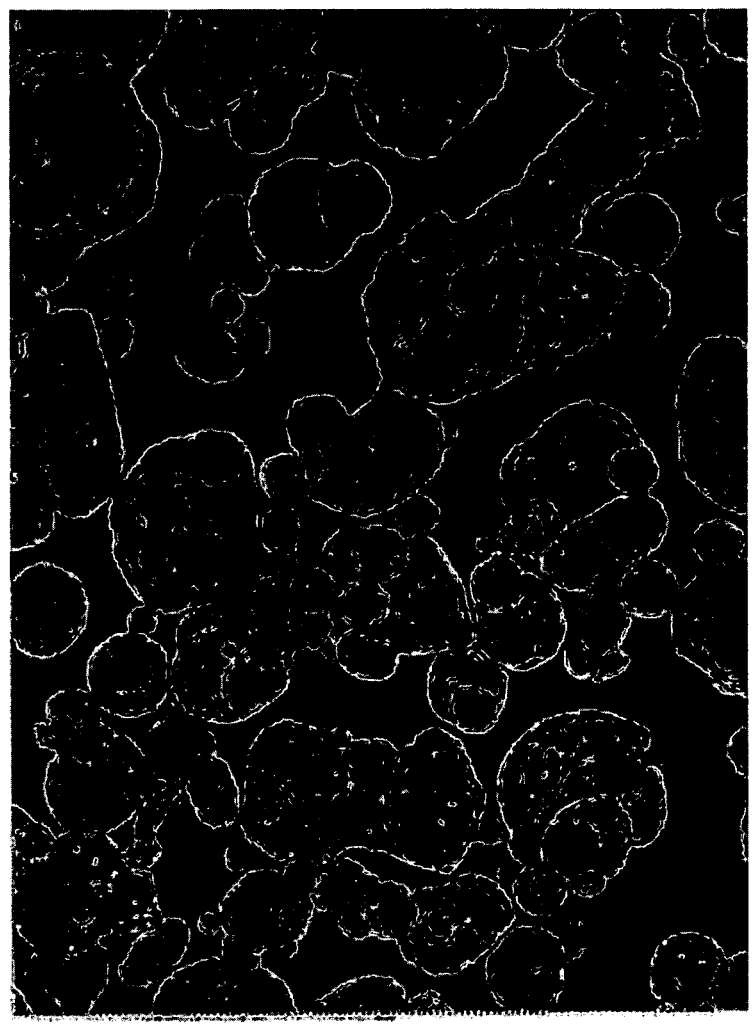
FIG. 1 shows an example of substantially spherical silver particles with partial aggregation (starting electrically conductive powder), wherein the tap density is 56%.

Best modes of the present invention will be described.

The electrically conductive powder includes polyhedral particles and substantially flaky particles that are substantially monodispersed. As used herein, the term substantially monodispersed means that most of the agglomerated particles are disagglomerated. The polyhedral particles include polyhedra having many fine planes, polyhedra with planar planes and curved surfaces, and polyhedra similar to cubes and rectangular parallelepipeds. The polyhedral particles can be obtained by rotationally flowing starting electrically conductive powder, together with beads thereby to disagglomerate and shape-transform the agglomerated particles. The starting electrically conductive powders include spherical particles, substantially spherical particles and teardrop-shaped particles The substantially flaky particles refer to particles having two substantially parallel surfaces or two large plane surfaces which are almost parallel each other. The shape of the entire particle is not particularly limited.

Materials of the electrically conductive powder are not particularly limited as long as they have electrical conductivity. Examples of the materials include silver, silver alloys (such as silver-copper, silver-tin), palladium, palladium alloys (such as palladium-silver), copper and copper alloys (such as copper-silver, cupper-tin).

The electrically conductive powder has particle size distribution in which large particles are not less in size than a particle size for which 30% of the total particles are smaller and small particles are less in size than a particle size for which 30% of the total particles are smaller. The particle size distribution is determined by laser diffractometry using a laser diffractometer manufactured by Malvern Instruments, NIKKISO CO., LTD., or Shimadzu Corporation.

The large particles preferably have an average particle diameter of 3 μm to 20 μm, more preferably 3 μm to 16 μm in view of printing properties and filling properties of the obtainable paste.

The small particles preferably have a higher average aspect ratio because such particles improve the contact among the large particles more efficiently. The average aspect ratio of the small particles is preferably larger than that of the large particles by at least 1.3 times, more preferably at least 1.5 times, still more preferably at least 2 times.

The number-average aspect ratio of the small particles is preferably not less than 3, more preferably not less than 4, still more preferably not less than 5. The upper limit is not particularly limited. When the average aspect ratio is more than 20, the small particles are easily oriented but the electric resistance and thermal resistance are often increased.

The average aspect ratio of the large particles is preferably from 1 to 6. When the large particles have a small average aspect ratio, the particles filled in a space between two plats are fewer than the particles having a large average aspect ratio beyond the range, surfaces of particles can be connected with each other through a small number of such particles. Because the number of the particles in contact becomes few, the resistance by the contact is small and good electrical conductivity and thermal conductivity are achieved. For this reason, it is more preferable that the average aspect ratio of the large particles is closer to 1. On the other hand, the average aspect ratio may be large when the particles is used for forming circuits on a surface, because it is more preferable that the particles are oriented more parallel to the surface. Thus, the average aspect ratio of the large particles is appropriately determined depending on uses. The average aspect ratio of the small particles which play a role to improve the contact among the large particles is suitably larger than that of the large particles by at least 1.3 times.

Preferably, the electrically conductive powder further includes easily-dispersible fine silver particles that have an average particle diameter of not more than 2.5 μm, and the weight ratio of the electrically conductive powder and the easily-dispersible fine silver particles is in the range of 95:5 to 55:45.

As used herein, the term easily-dispersible fine silver particles refers to particles that are so weakly agglomerated that they are easily dispersed. Moreover they have a relatively high tap density. The average primary particle diameter of the easily-dispersible fine silver particles is not more than 2.5 μm, more preferably not more than 2 μm, still more preferably not more than 1.6 μm. The relative tap density is preferably not less than 45%, more preferably not less than 50%, still more preferably not less than 55%. Easily-dispersible fine silver particles larger than the size described above cannot fill the spacings between the large particles appropriately. When the tap density is less than 45%, the fine particles are strongly agglomerated and cannot fill the spacings between the large particles appropriately. The easily-dispersible fine silver particles are preferably shaped in view of dispersibility and prevention of viscosity increase. The invention may employ substantially flaky easily-dispersible fine silver particles which show high dispersibility. As used herein, the term high dispersibility means that the tap density is high as described above. In the case of the substantially flaky easily-dispersible fine silver particles, the tap density will be suitably not less than 35%. Examples of the easily-dispersible fine silver particles include fine silver particles resulting from reduction and precipitation of silver, and fine silver particles produced by atomization. These fine silver particles are generally agglomerated and may be shaped for the easily-dispersible bulky polyhedral shapes to increase dispersibility.

The weight ratio of the electrically conductive powder and the easily-dispersible fine silver particles is in the range of 95:5 to 55:45, preferably 95:5 to 60:40, more preferably 95:5 to 70:30. When the amount of the easily-dispersible fine silver particles is more than said range, the particles are too many. Therefore, contact points of the particles become too many, and the electrical conductivity and the thermal conductivity are deteriorated.

In another embodiment, the electrically conductive powder may further include agglomerated ultra fine silver particles, the ultra fine silver particles have an average primary particle diameter of not more than 0.3 μm. The weight ratio of the electrically conductive powder, the easily-dispersible fine silver particles and the agglomerated particles of the ultra fine silver particles is in the range of 94.525:4.975:0.5 to 52.25:42.75:5.00. Any excessive amount of the agglomerated particles of the ultra fine silver particles is unfavorable because the particles have too many contact points and the agglomerated particles of the ultra fine silver particles deteriorate the tap density of the electrically conductive powder, resulting in lower electrical conductivity and thermal conductivity. If the amount of the agglomerated particles of the ultra fine silver particles falls short of the above range, they cannot fill the spacings between the shaped electrically conductive particles sufficiently. The insufficient contact of the particles can reduce the electrical conductivity and the thermal conductivity. The ultra fine silver particles forming the agglomerated particles have an average primary particle diameter of not more than 0.3 μm, more preferably not more than 0.2 μm, still more preferably not more than 0.15 μm. If the ultra fine silver particles of the agglomerated particles have an average primary particle diameter exceeding this range, the ultra fine silver particles filling the spacings between the easily-dispersible fine silver particles and the substantially disagglomerated large and small particles will fail to increase the packing density but will reduce the packing density by contrast.

When the content of the easily-dispersible fine silver particles is small, printing properties of the obtainable paste are deteriorated. Thus, in the case of a printing paste, the easily-dispersible fine silver particles account for 5 to 30%, preferably 10 to 30%, more preferably 15 to 30%.

Materials of the substantially disagglomerated electrically conductive powder are not particularly limited as long as they have electrical conductivity. Examples of the materials include silver, silver alloys (silver-copper, silver-tin), palladium, palladium alloys (palladium-silver), copper and copper alloys (copper-silver, copper-tin). In particular, the substantially disagglomerated electrically conductive powder preferably comprises silver, a silver alloy, or copper or a copper alloy coated with silver. When the substantially disagglomerated electrically conductive powder comprises copper or a copper alloy coated with silver, the weight ratio of copper and silver (copper:silver) is preferably in the range of 95:5 to 65:35.

When solder wettability is required, the substantially disagglomerated electrically conductive powder preferably accounts for a large proportion. Much silver causes solder reach. Therefore, the amount of silver is not necessarily large. It is therefore preferable that the outermost surface is silver, and unoxidized copper is immediately below the outermost silver surface. The amount of silver is preferably in the range of 5% to 20%, more preferably 7.5% to 20%. As used herein, the unoxidized copper refers to copper which, when the copper particles are shaped, is diffused in the vicinity of the outermost surface and forms an alloy layer with silver in the silver surface layer. This copper is not oxidized. The phrase "the outermost surface is silver, and unoxidized copper is immediately below the outermost silver surface" does not mean that the surface of copper is simply plated with silver. In a just plating layer, there is no unoxidized copper in the vicinity of the outermost surface. The unoxidized copper is obtainable only when the silver-plated copper particles are shaped as described later.

When the amount of silver exceeds the above range, the silver layer forming the surface of the particles increases in thickness and the surface of the particles becomes soft. Such soft surface improves the contact efficiency of the electrically conductive powder and the obtainable paste will show high electrical conductivity and thermal conductivity. On the other hand, when the amount of silver is less than the above range, it is difficult that the copper surface is coated with silver uniformly, and the improvement of anti-migration properties is often small. When the amount of copper exceeds the above-described range and the amount of silver falls short of the above range, the electrically conductive powder may increase conduction resistance or may be color-changed during storage. When the amount of silver is too small, silver cannot coat the surface of the copper core sufficiently and will increase the probability of oxidation, often causing bad electrical conductivity and low anti-migration properties.

Silver in the surface layer may form an alloy layer in combination with copper in the vicinity of the outermost surface. The silver surface layer is soft and can follow the change in shape of the copper core layer. When silver in the surface layer forms an alloy with copper in the vicinity of the outermost surface of the core layer, the surface layer is composed of the silver layer and the silver/copper alloy layer. The silver layer and the silver/copper alloy layer prevent copper from oxidation. The unoxidized copper in the vicinity of the surface layer prevents silver migration. In particular, the small particles shaped to have a high aspect ratio has a high specific surface area. Therefore, the small particles contain much unoxidized active copper. The electrically conductive powder containing a large amount of such small particles shows high anti-migration properties even when used in combination with the fine silver particles. The copper layer should be active in order to prevent silver migration. General copper powder has very low anti-migration properties because the surface of the copper powder is oxidized and the oxidized copper layer does not have activity of anti-migration.

A paste of the electrically conductive powder having the above silver amount may be used for the electrically conductive bonding between tin-plated or tin-coated terminals of an electronic part and copper wiring layers. Because the amount of silver in the paste is small, it is unlikely that tin is diffused to silver in the electrically conductive powder, and voids by formation of tin/silver alloy are avoided.

Electrically conductive powder obtained by simply smoothing the non smooth silver-coated surface layer, in which grain boundaries of the silver-plated grains remain, on silver-coated copper particles is poor in anti-migration properties because there is no unoxidized copper in the vicinity of the outermost surface.

The small particles play a role to strengthen the contact between the large particles. A mixture of these particles is electrically conductive powder having good electrical and thermal conductivities.

When silver-coated copper particles and the like are used directly without treatment as electrically conductive powder, a large amount of a binder is required because of the aggregation of the silver-coated copper particles. However, the increase of binder amount leads to the following defects. The electrically conductive paste has excellent printing properties and filling properties. In such paste, however, the electrically conductive particles will contact each other and connected points will become low and cause bad electrical conductivity.

In contrast, the electrically conductive particles of the present invention are substantially disagglomerated and are easily mixed with other electrically conductive particles, and the obtainable mixed powder will show stable characteristics. Because the electrically conductive particles are substantially disagglomerated, they may be easily and quickly mixed and dispersed in a binder composition to give a uniform paste.

For the electrically conductive particles to be substantially disagglomerated, the surface of the particles is treated with a fatty acid. Examples of the fatty acids for use in the present invention include saturated fatty acids such as stearic acid, lauric acid, capric acid and palmitic acid, and unsaturated fatty acids such as oleic acid, linoleic acid, linolenic acid and sorbic acid. The amount of the fatty acid is preferably small. Excessive amount of the fatty acid causes aggregation of the particles because the extra fatty acid functions as a core of aggregation. Specifically, the amount of the surface treatment is preferably from 0.02 wt % to 0.5 wt %, more preferably from 0.02 wt % to 0.3 wt %, still more preferably from 0.02 wt % to 0.25 wt % based on the electrically conductive powder.

The electrically conductive powder preferably has a press density in the range of 80 to 99%.

The press density of conventional electrically conductive powder ranges from 50 to 75%, and that of small flaky particles ranges from 50 to 70%. When conventional electrically conductive powder is sequentially mixed with a binder composition, the mixture has relatively high viscosity and is non-uniform, and it is difficult to mix well fine silver particles with large particles.

In contrast, the electrically conductive powder of the present invention has a high press density and is mixed with a binder composition to give a low viscosity paste. According to the present invention, a paste having a high content of the electrically conductive powder is easily produced. A paste of the electrically conductive powder with a relatively high tap density and a relatively low press density provides a relatively high packing density of the electrically conductive powder. By pressing through-holes filled with this paste, the contact between the electrically conductive particles is increased, and the packed particles show high electrical conductivity and thermal conductivity.

When a paste of the electrically conductive powder with a high press density is supplied to the spacing between plates and the plates are approximated so as to narrow the spacing, the electrically conductive powder remains between the plates but the binder composition is squeezed out, and the electrically conductive particles between the plates contact each other more tightly. Thus, the electrically conductive powder having a high press density according to the present invention is advantageously used in a thermally conductive grease for high thermal conductivity between surfaces.

When the paste is filled or applied and is pressed to achieve high electrical conductivity as described above, the electrically conductive powder preferably has a high tap density and a low press density. In the present invention, these properties may be controlled by appropriately selecting the starting electrically conductive powder and appropriately shaping the particles.

Because the electrically conductive powder of the present invention may be easily packed densely, the amount of a binder in the paste may be small. In order that the particles contact each other favorably and provide good electrical conductivity, the amount of a binder may be from 0.3% to less than 7%, preferably from 0.5% to less than 5%, more preferably from 0.5% to less than 4%. In particular, the electrically conductive paste of the invention may be applied on a surface such as a film to print a circuit, and the printed films may be laminated to make multicircuit board. The circuit of the electrically conductive paste printed on the film is sandwiched and pressed between the films to achieve high electrical conductivity. In this case, it is not necessary that the circuit of the electrically conductive paste has high adhesion to the film. Because the paste of the electrically conductive powder with a high press density contains a small amount of a binder, the particles are packed densely by pressing the low-binder paste to provide high electrical conductivity, for example a volume resistivity value of 3 to 8 μΩcm in the case of silver powder of the invention.

The electrically conductive powder according to the present invention can achieve better contact of the particles as compared with powder of spherical particles. In the present invention, the small particles with a high average aspect ratio and the easily-dispersible fine silver particles fill the spacings between the large particles. When a high stress is applied between the large particles, the small particles and the easily-dispersible fine silver particles are collapsed to enhance the conduction between the large particles or between the large particles and surfaces. The tap density and the press density may be controlled by using in combination electrically conductive powder obtained from starting powder of different shape, the easily-dispersible fine silver particles, and the agglomerated ultra fine silver particles.

The tap density (%) in the present invention is a percentage of a density obtained by tapping the particles relative to a true density of the particles. To determine the tap density of the particles in the present invention, the particles are tapped 1000 times with a stroke of 25 mm, the packing density of the tapped particles is calculated from the volume and mass, and the packing density is divided by a true density or a theoretical density of the particles. For example, in the case of silver-plated copper powder, the theoretical density is calculated on a pro-rata basis of the contents and true densities of silver and copper.

The press density as used herein is calculated as follows. The electrically conductive powder is put in between planes in a cylinder, and the surfaces are pressed at a pressure of 0.2 MPa. The apparent density is calculated from the mass of the electrically conductive powder and the volume obtained from a distance between the planes and an area of the planes. The apparent density is divided by a true density of the electrically conductive powder.

The aspect ratio is a ratio of a longer diameter to a shorter diameter of a particle (longer diameter/shorter diameter). For example, the aspect ratio may be determined by measuring longer and shorter diameters of particles in an electron micrograph. The size of particles, namely, longer diameters of particles may be measured with a scanning electron micrograph. On the other hand, shorter diameters of particles are the thickness of the particles. Because the thickness of the particles cannot be measured with a scanning electron micrograph, a sample table on which the particles are placed is inclined at an angle, and an electron micrograph is taken from above. A correction is made to correct for the angle of the sample table. The thickness of the particles can be thus measured.

The electrically conductive powder of the invention can be formed into a paste having excellent electrical conductivity and thermal conductivity.

Spherical particles smoothly slide on one another and are highly packed easily. However, because they are in contact at points, high packing density will not lead to high electrical conductivity and thermal conductivity.

Figure 6:
FIG. 6 is a cross sectional view of a cured product from a paste of electrically conductive powder that includes polyhedral and substantially flakey large and small particles and easily-dispersible silver fine particles, wherein the density of the cured product is 8.6 g/cm$^3$ and the relative density of the cured product including the binder is 98.5% (voids: 1.5%).

FIG. 6 is a cross sectional view of a cured product from a paste of the electrically conductive powder (including the easily-dispersible fine silver particles) of the present invention. As shown in FIG. 6, the large particles are in contact at planes, and the small particles with a high average aspect ratio and the easily-dispersible fine silver particles fill the spacings between the large particles. This powder configuration shows that the particles provide high electrical conductivity and thermal conductivity.

The paste of electrically conductive powder according to the present invention includes the electrically conductive powder described above and a binder component. The binder accounts for 0.3 to 7 wt % of the total weight of a solid in the binder component and the electrically conductive powder. The binder enhances the adhesion of the electrically conductive powder to a base. Further, the paste can be solidified by the binder. Examples of the binders include epoxy resins, phenol resins, polyester resins, polyurethane resins, phenolic resins, polyester resins and acrylic resins.

The electrically conductive powder may be produced as follows. In the process for producing the electrically conductive powder according to the invention, starting electrically conductive powder and beads having a fine particle diameter are fed in a container, and the starting electrically conductive powder and the beads are fluidized by rotating the container to disagglomerate and shape-transform starting electrically conductive powder into polyhedral particles and substantially flaky particles.

When the starting electrically conductive powder and the fine beads are placed and then rotationally stirred in the container, the starting electrically conductive powder is disagglomerated and shaped by the beads into polyhedral particles and substantially flaky particles. Small particles in the starting electrically conductive powder are shaped into the substantially flaky particles having a larger average aspect ratio than large particles. The fine beads preferably have an average particle diameter of not more than 10 mm, more preferably not more than 5 mm, still more preferably not more than 3 mm. The beads preferably have a low mass, and materials with a smaller density than metal particles are preferable, with examples including glass and ceramics such as zirconia and alumina.

The materials of the starting electrically conductive powder are not particularly limited as long as they have electrical conductivity. Examples of the materials include silver, silver alloys (silver-copper, silver-tin), palladium, palladium alloys (palladium-silver), copper and copper alloys (copper-silver, copper-tin).

Primary particles in the starting electrically conductive powder are disagglomerated and shaped into the polyhedral particles and the substantially flaky particles. The size of these particles is substantially almost equal to the large particles (starting materials).

Figure 3:
FIG. 3 shows an example of agglomerated substantially spherical silver-plated copper powder (starting electrically conductive powder), wherein the tap density is 33%.

FIGS. 1 and 3 are scanning electron micrographs of starting electrically conductive powder used in the present invention. FIG. 1 shows silver powder, and FIG. 3 shows silver-plated copper powder.

When the beads and starting electrically conductive powder are fed in a large-diameter container, a drop distance of the beads is too long and the bead collision energy is so high that the particles are shaped before they are sufficiently disagglomerated. Consequently, it is difficult to obtain disagglomerated, small particles having a high aspect ratio.

When the container is rotated too fast, the collision of the beads in the container produces so large collision energy that the particles are excessively shaped. Consequently, it is difficult to obtain small particles having a high average aspect ratio. When the container is rotated too slowly, it is not preferred that disaggromerateing and shaping the particles take a long time. The rotation speed is suitably from 10 to 100 rpm, preferably from 30 to 80 rpm.

The container, in which the beads and the starting electrically conductive powder are fed, preferably has an inner diameter of from 10 cm to 80 cm, more preferably from 10 cm to 60 cm, still more preferably from 10 cm to 40 cm. The volume of the beads placed in the container is preferably in a range of for about 20 to 80%, more preferably 30 to 70%, still more preferably 40 to 70% of the effective volume of the container. When the beads volume is more than this range, the agglomerated particles of the starting electrically conductive powder will not be disagglomerated smoothly and the starting electrically conductive powder will not be shaped effectively. If the beads volume is less than this range, the starting electrically conductive powder will not be disagglomerated and shaped efficiently.

The volume ratio of the beads and the starting electrically conductive powder (beads: starting electrically conductive powder) is preferably from 50:50 to 96:4, more preferably from 60:40 to 96:4, still more preferably from 70:30 to 95:5. The volume of the beads and that of the starting electrically conductive powder are calculated by their bulk densities. If the proportion of the starting electrically conductive powder is less than the above, the treatment efficiency is bad. When the proportion of the starting electrically conductive powder is more than the above, the starting electrically conductive powder is neither disagglomerated nor shaped efficiently.

The treatment time for shaping the starting electrically conductive powder by rotating the container is variable depending on the size of the container, the amount of the beads, the amount of the starting electrically conductive powder, and the rotation speed of the container. The treatment is continued appropriately while checking the tap density of the electrically conductive powder and the shape of the particles. The treatment time is generally from about 2 hours to 100 hours.

Mixing method of the electrically conductive powder of the present invention with the easily-dispersible fine silver particles and the agglomerated particles of the ultra fine silver particles is not limited. Preferably, they are mixed by a method which will not deform the particles. Exemplary methods include use of a V blender, a ball mill without balls (medium), and a planetary mixer. In the case of the ball mill without balls (medium), the particles are introduced into the mill without balls, and the mill is rotated to mix the electrically conductive particles. When the particles are mixed, they may be added sequentially and the addition order is not particularly limited.

Figure 2:
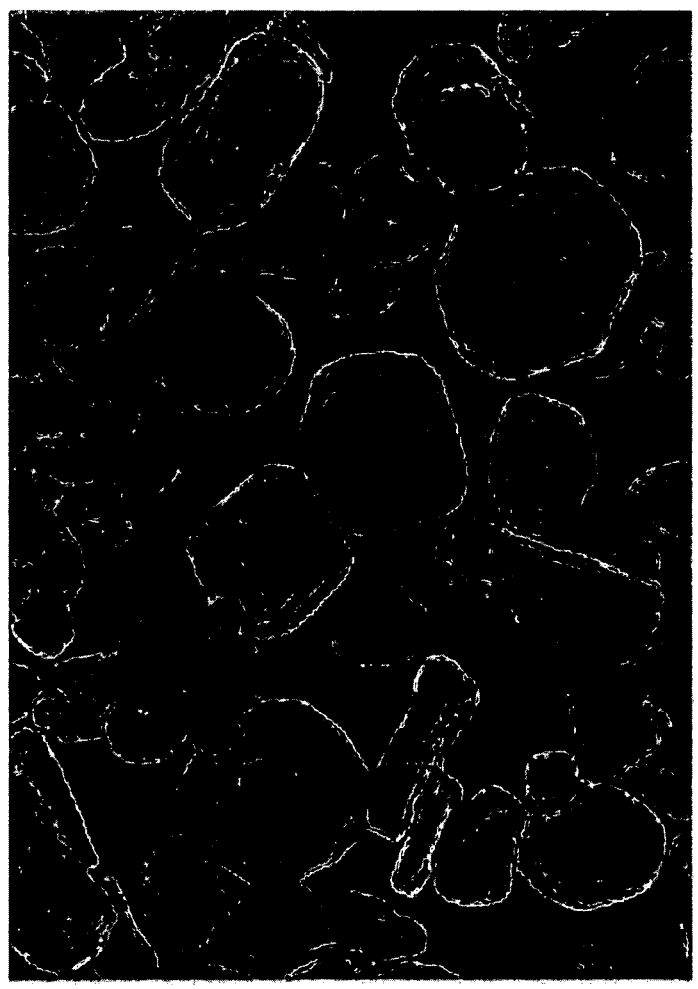
FIG. 2 shows electrically conductive powder (silver) obtained by disagglomerating and shaping the silver particles of FIG. 1 into polyhedral particles and substantially flakey particles, wherein the tap density is 66%.
Figure 4:
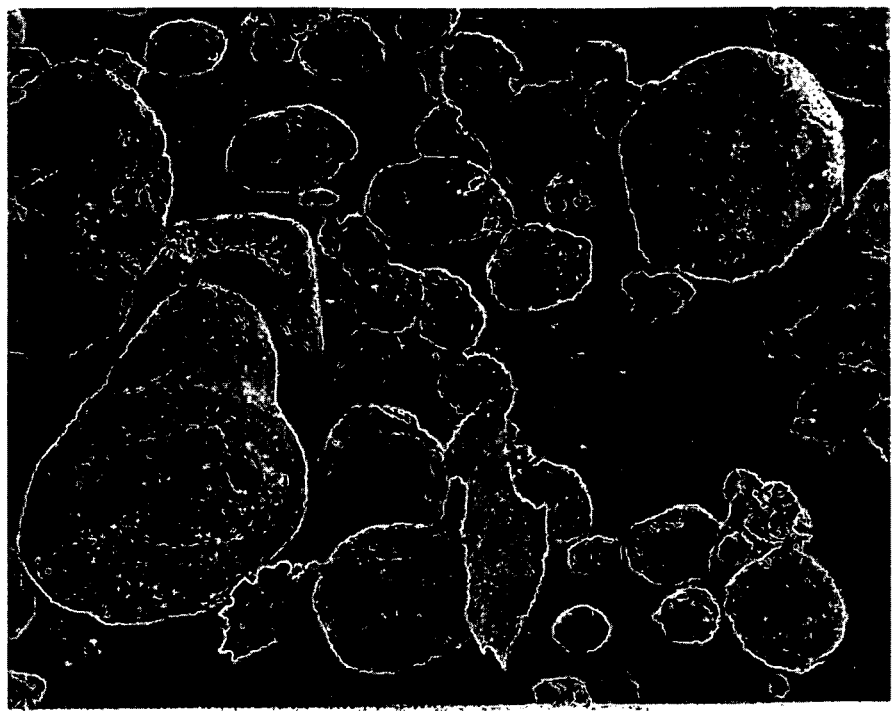
FIG. 4 shows electrically conductive powder (silver-plated copper powder) obtained by disagglomerating and shaping the starting electrically conductive powder of FIG. 3 into polyhedral particles and substantially flakey particles, wherein the tap density of the substantially flakey particles is 61%.

FIGS. 2 and 4 are scanning electron micrographs of treated powder (FIGS. 2 and 4 correspond to FIGS. 1 and 3, respectively).

Figure 5:
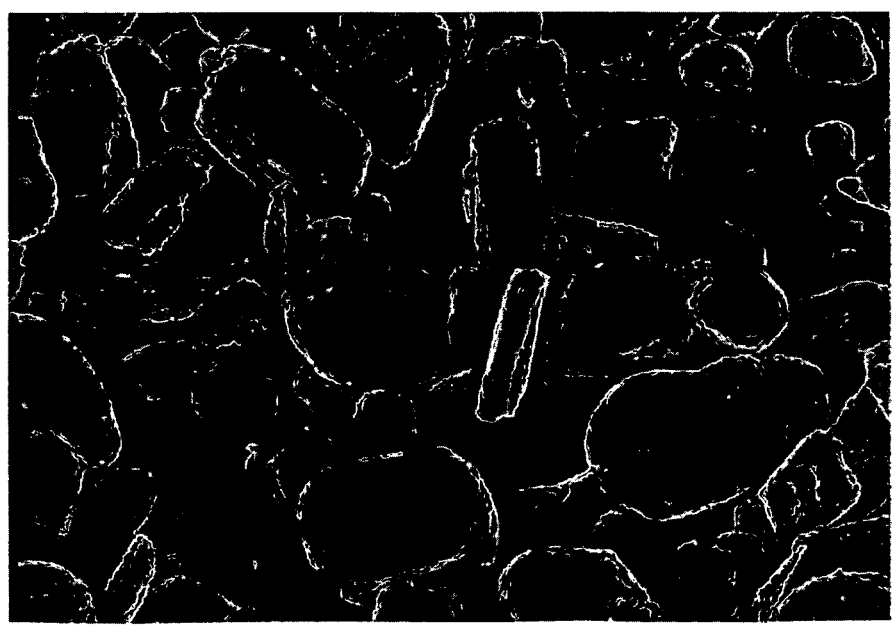
FIG. 5 shows electrically conductive powder obtained by further shaping the particles of FIG. 4 into a greater aspect ratio of flakey particles, wherein the tap density is 59%.

FIG. 5 shows particles obtained by further shaping the particles of FIG. 4 into a greater aspect ratio.

The mixing time may be appropriately determined depending on the type and volume of the apparatus, and the amounts of the particles.

Process for Producing Paste of Electrically Conductive Powder

The paste of electrically conductive powder according to the present invention may be produced as follows. The binder component, the agglomerated particles of the ultra fine silver particles and the easily-dispersible fine silver particles are added to a solvent to give a dispersion. Shear stress is applied to the slurry dispersion to disagglomerate the agglomerated particles of the ultra fine silver particles and the easily-dispersible fine silver particles. Then the electrically conductive powder is added to the slurry dispersion, and the mixture is uniformly mixed.

The ratio of these components is not limited as long as an objective paste can be obtained. A three-roll mill, a planetary mixer, an agitating blade or the like may be used to apply shear force to the dispersion to disagglomerate the agglomerated particles of the ultra fine silver particles and the easily-dispersible fine silver particles. As required, ethyl carbitol, butyl carbitol or the like may be added.

EXAMPLES

The present invention will be described by examples below.

Example 1

Substantially spherical silver powder having an average particle diameter of 5.2 μm was used as starting electrically conductive powder. The tap density of the starting electrically conductive powder was 53%. The silver powder was surface treated with 0.1 wt % of stearic acid, and 500 g of the powder was fed in a 2-L ball mill. The ball mill contained 1 liter of glass beads with a diameter of about 2 mm. The volume ratio of the beads and the electrically conductive powder (beads: electrically conductive powder) was 11.1:1. The ball mill had a diameter of about 12 cm. The ball mill was rotated at a rotation speed of 50 $\text{min}^{-1}$ for 4 hours to treat the powder.

The resultant electrically conductive powder was observed by SEM. The average particle diameter was 6.0 μm. Large particles being not less in size than the particle size for which 30% of the total particles were smaller had an average aspect ratio of 2.3. The diameter for which 30% of the total particles were smaller was 2.5 μm. Small particles being less in size than the particle size for which 30% of the total particles were smaller had an average aspect ratio of 7.3. The tap density of the electrically conductive powder was 64.1%. The electrically conductive powder was stored at normal temperature and normal humidity for 12 months, but the powder was not discolored.

Separately, a binder was prepared by uniformly mixing 85 parts by weight of a bisphenol F epoxy resin having an epoxy equivalent of 170 g/eq (EPOMIK R110 manufactured by Mitsui Chemicals, Inc.), 10 parts by weight of a monoepoxide (GLYCIROL ED-509 manufactured by ADEKA CORPORATION), and 5 parts by weight of 2-phenyl-4-methyl-imidazole (CUREZOL 2P4MZ manufactured by SHIKOKU CHEMICALS CORPORATION).

Thereafter, 93 g of the electrically conductive powder was added to 7 g of the binder, and they were mixed to give a paste. The paste was applied on a cleaned glass slide to print two pairs of comb electrodes in which the linewidth was 0.5 mm, the line spacing was 2 mm, and the parallel length was 40 mm. The paste was dried. Thus, a test piece was prepared.

Filter paper was placed on the parallel lines of the comb pattern of the test piece and was wetted by dropping ion exchange water thereon. A direct current voltage of 30 V was applied between the opposed comb electrodes. Anti-migration properties were tested by measuring a change of leakage current between the comb electrodes. As a result, the current flowing between the opposed comb electrodes became 5 mA in 57 seconds. Separately, the paste was applied to print a circuit having a line length of 115 mm and a linewidth of 0.8 mm, and the paste was dried and cured at 185° C. for 30 minutes. The circuit had a volume resistivity value of 14 $\mu\Omega$·cm. Separately, the paste was repeatedly spread and dried carefully not to incorporate voids. The thus-printed laminate was dried to give a test piece having a thickness of 1.3 mm. The test piece had a thermal conductivity of 46 $Wm^{-1}K^{-1}$.

Example 2

Substantially spherical silver powder having an average particle diameter of 5.2 µm was used as starting electrically conductive powder. The tap density of the starting electrically conductive powder was 53%. The silver powder was surface treated with 0.1 wt % of oleic acid, and 700 g of the powder was fed in a 3-L ball mill. The ball mill contained 1.5 liters of glass beads with a diameter of about 2 mm. The volume ratio of the beads and the electrically conductive powder (beads:electrically conductive powder) was 10.9:1. The ball mill had a diameter of about 14 cm. The ball mill was rotated at a rotation speed of 48 $min^{-1}$ for 6 hours to treat the powder.

Example 3

Substantially spherical silver powder having an average particle diameter of 8.9 µm was used as starting electrically conductive powder. The tap density of the starting electrically conductive powder was 54%. The silver powder was surface treated with 0.1 wt % of stearic acid, and 1500 g of the powder was fed in a 5-L ball mill. The ball mill contained 3 liters of glass beads with a diameter of about 2 mm. The volume ratio of the beads and the electrically conductive powder (beads:electrically conductive powder) was 11.3:1. The ball mill had a diameter of about 17 cm. The ball mill was rotated at a rotation speed of 40 $min^{-1}$ for 6 hours to treat the powder.

Example 4

Substantially spherical silver powder having an average particle diameter of 8.9 µm was used as starting electrically conductive powder. The tap density of the starting electrically conductive powder was 54%. The silver powder was surface treated with 0.05 wt % of stearic acid, and 2500 g of the powder was fed in a 10-L ball mill. The ball mill contained 6 liters of glass beads with a diameter of about 2 mm. The volume ratio of the beads and the electrically conductive powder (beads:electrically conductive powder) was 13.6:1. The ball mill had a diameter of about 21 cm. The ball mill was rotated at a rotation speed of 35 $min^{-1}$ for 8 hours to treat the powder.

Example 5

Starting electrically conductive powder used in this example was substantially spherical silver-plated copper powder that had been obtained by plating starting copper powder having an average particle diameter of 5.5 µm with 15 wt % of silver. The tap density of the starting electrically conductive powder was 45%. The silver-plated copper powder was surface treated with 0.2 wt % of stearic acid, and 500 g of the powder was fed in a 2-L ball mill. The ball mill contained 1 liter of alumina beads with a diameter of about 4 mm. The volume ratio of the beads and the electrically conductive powder (beads:electrically conductive powder) was 8.3:1. The ball mill had a diameter of about 12 cm. The ball mill was rotated at a rotation speed of 60 $min^{-1}$ for 2 hours to treat the powder.

A paste was prepared by using the treated powder in the same manner as in Example 1, and comb electrodes were printed with the paste and were tested for anti-migration properties. Separately, a thermal conductivity test piece was prepared with the paste in the same manner as in Example 1.

A surface of the test piece was lightly polished with abrasive paper No. 800. The test piece was immersed in a solder bath at 260° C., and the surface was coated with solder. The test piece was slit into pieces with 0.5 mm width, but the solder was not released. This result proved high wettability of the test piece with solder.

Example 6

Starting electrically conductive powder used in this example was substantially spherical silver-plated copper powder that had been obtained by plating starting copper powder having an average particle diameter of 5.5 µm with 20 wt % of silver. The tap density of the starting electrically conductive powder was 45%. The silver-plated copper powder was surface treated with 0.3 wt % of stearic acid, and 1500 g of the powder was weighed in a S-L ball mill. The ball mill contained 3 liters of glass beads with a diameter of about 2 mm. The volume ratio of the beads and the electrically conductive powder (beads:electrically conductive powder) was 8.3:1. The ball mill had a diameter of about 17 cm. The ball mill was rotated at a rotation speed of 46 $min^{-1}$ for 4 hours to treat the powder.

Example 7

Starting electrically conductive powder used in this example was teardrop-shaped silver-plated copper powder that had been obtained by plating starting copper powder having an average particle diameter of 5.9 µm with 20 wt % of silver. The tap density of the starting electrically conductive powder was 39%. The silver-plated copper powder was surface treated with 0.15 wt % of oleic acid, and 700 g of the powder was fed in a 3-L ball mill. The ball mill contained 1.5 liters of glass beads with a diameter of about 2 mm. The volume ratio of the beads and the electrically conductive powder (beads:electrically conductive powder) was 7.7:1. The ball mill had a diameter of about 14 cm. The ball mill was rotated at a rotation speed of 50 $min^{-1}$ for 6 hours to treat the powder.

Example 8

Starting electrically conductive powder used in this example was substantially spherical silver-plated copper powder that had been obtained by plating starting copper powder having an average particle diameter of 5.5 µm with 30 wt % of silver. The tap density of the starting electrically conductive powder was 45%. The silver-plated copper powder was surface treated with 0.1 wt % of stearic acid, and 500 g of the treated powder was fed in a 2-L ball mill. The ball mill contained 1 liter of glass beads with a diameter of about 2 mm.

The volume ratio of the beads and the electrically conductive powder (beads:electrically conductive powder) was 8.4:1. The ball mill had a diameter of about 12 cm. The ball mill was rotated at a rotation speed of 40 min$^{-1}$ for 20 hours to treat the powder.

Example 9

Starting electrically conductive powder used in this example was substantially spherical silver-plated copper powder that had been obtained by plating starting copper powder having an average particle diameter of 5.5 μm with 30 wt % of silver. The tap density of the starting electrically conductive powder was 37%. The silver-plated copper powder was surface treated with 0.1 wt % of stearic acid, and 2000 g of the treated powder was fed in a 10-L ball mill. The ball mill contained 4 liters of alumina beads with a diameter of about 3 mm. The volume ratio of the beads and the electrically conductive powder (beads:electrically conductive powder) was 6.9:1. The ball mill had a diameter of about 21 cm. The ball mill was rotated at a rotation speed of 35 min$^{-1}$ for 6 hours to treat the powder.

Example 10

Starting electrically conductive powder used in this example was teardrop-shaped silver-plated copper powder that had been obtained by plating starting copper powder having an average particle diameter of 5.9 μm with 40 wt % of silver. The tap density of the starting electrically conductive powder was 38%. The silver-plated copper powder was surface treated with 0.1 wt % of stearic acid, and 600 g of the treated powder was fed in a 2-L ball mill. The ball mill contained 1 liter of zirconia beads with a diameter of about 1 mm. The volume ratio of the beads and the electrically conductive powder (beads:electrically conductive powder) was 6:1. The ball mill had a diameter of about 12 cm. The ball mill was rotated at a rotation speed of 50 min$^{-1}$ for 8 hours to treat the powder.

Example 11

Starting electrically conductive powder used in this example was substantially spherical silver-plated copper powder that had been obtained by plating starting copper powder having an average particle diameter of 5.5 μm with 20 wt % of silver. The tap density of the starting electrically conductive powder was 43%. The silver-plated copper powder was surface treated with 0.2 wt % of stearic acid, and 500 g of the treated powder was fed in a 3-L ball mill. The ball mill contained 1.5 liters of zirconia beads with a diameter of about 10 mm. The volume ratio of the beads and the electrically conductive powder (beads:electrically conductive powder) was 11.9:1. The ball mill had a diameter of about 14 cm. The ball mill was rotated at a rotation speed of 40 min$^{-1}$ for 3 hours to treat the powder.

Example 12

Starting electrically conductive powder used in this example was substantially spherical silver-plated copper powder that had been obtained by plating starting copper powder having an average particle diameter of 5.5 μm with 20 wt % of silver. The tap density of the starting electrically conductive powder was 43%. The silver-plated copper powder was surface treated with 0.2 wt % of stearic acid, and 500 g of the treated powder was fed in a 3-L ball mill. The ball mill contained 1.5 liters of alumina beads with a diameter of about 3 mm. The volume ratio of the beads and the electrically conductive powder (beads:electrically conductive powder) was 11.9:1. The ball mill had a diameter of about 14 cm. The ball mill was rotated at a rotation speed of 40 min$^{-1}$ for 6 hours to treat the powder.

Example 13

Starting electrically conductive powder used in this example was substantially spherical silver-plated copper powder that had been obtained by plating starting copper powder having an average particle diameter of 5.5 μm with 30 wt % of silver. The tap density of the starting electrically conductive powder was 37%. The silver-plated copper powder was surface treated with 0.1 wt % of stearic acid, and 2000 g of the treated powder was fed in a 10-L ball mill. The ball mill contained 4 liters of alumina beads with a diameter of about 3 mm. The volume ratio of the beads and the electrically conductive powder (beads:electrically conductive powder) was 6.9:1. The ball mill had a diameter of about 21 cm. The ball mill was rotated at a rotation speed of 25 min$^{-1}$ for 48 hours to treat the powder.

Example 14

Starting electrically conductive powder used in this example was substantially spherical silver-plated copper powder that had been obtained by plating starting copper powder having an average particle diameter of 5.5 μm with 20 wt % of silver. The tap density of the starting electrically conductive powder was 43%. The silver-plated copper powder was surface treated with 0.2 wt % of stearic acid, and 500 g of the treated powder was fed in a 3-L ball mill. The ball mill contained 1.5 liters of glass beads with a diameter of about 2 mm. The volume ratio of the beads and the electrically conductive powder (beads:electrically conductive powder) was 11.9:1. The ball mill had a diameter of about 14 cm. The ball mill was rotated at a rotation speed of 36 min$^{-1}$ for 72 hours to treat the powder.

Example 15

Starting electrically conductive powder used in this example was substantially spherical silver-plated copper powder that had been obtained by plating starting copper powder having an average particle diameter of 10.4 μm with 10 wt % of silver. The tap density of the starting electrically conductive powder was 47%. The silver-plated copper powder was surface treated with 0.1 wt % of stearic acid, and 2500 g of the treated powder was fed in a 10-L ball mill. The ball mill contained 7 liters of glass beads with a diameter of about 2 mm. The volume ratio of the beads and the electrically conductive powder (beads:electrically conductive powder) was 12:1. The ball mill had a diameter of about 21 cm. The ball mill was rotated at a rotation speed of 40 min$^{-1}$ for 6 hours to treat the powder.

Example 16

Starting electrically conductive powder used in this example was substantially spherical silver-plated copper powder that had been obtained by plating starting copper powder having an average particle diameter of 10.7 μm with 10 wt % of silver. The tap density of the starting electrically conductive powder was 47%. The silver-plated copper powder was surface treated with 0.1 wt % of stearic acid, and 15000 g of the treated powder was fed in a 50-L ball mill. The ball mill contained 30 liters of glass beads with a diameter of about 2 mm. The volume ratio of the beads and the electrically conductive powder (beads:electrically conductive powder) was 8.6:1. The ball mill had a diameter of about 38 cm. The ball mill was rotated at a rotation speed of 20 min$^{-1}$ for 8 hours to treat the powder.

Example 17

Starting electrically conductive powder used in this example was substantially spherical silver-plated copper powder that had been obtained by plating starting copper powder having an average particle diameter of 10.7 μm with 10 wt % of silver. The tap density of the starting electrically conductive powder was 47%. The silver-plated copper powder was surface treated with 0.1 wt % of stearic acid, and 12000 g of the treated powder was fed in a 50-L ball mill. The ball mill contained 30 liters of glass beads with a diameter of about 2 mm. The volume ratio of the beads and the electrically conductive powder (beads:electrically conductive powder) was 10.7:1. The ball mill had a diameter of about 38 cm. The ball mill was rotated at a rotation speed of 25 min$^{-1}$ for 10 hours to treat the powder.

The electrically conductive powders of Examples 2 to 17 and pastes prepared by using the powders were evaluated in the same manner as in Example 1. The results are shown in Table 1.

powder was fed in a 2-L ball mill. The ball mill contained 1.2 liters of zirconia balls with a diameter of about 10 mm. The ball mill was rotated at a rotation speed of 50 min$^{-1}$ for 200 hours to treat the powder.

The resultant electrically conductive powder had an average particle diameter of 15.5 μm. The diameter for which 30% of the total particles were smaller was 4.5 μm. SEM observation showed that large particles had an average aspect ratio of 18.9, and small particles had an average aspect ratio of 31. The tap density of the electrically conductive powder was 40.7%. The electrically conductive powder was stored in the atmosphere for 12 months, but the powder was not discolored.

Thereafter, the electrically conductive powder was mixed with a binder in the same ratio as in Example 1. The mixture did not form a paste because of insufficiency of the binder.

Comparative Example 2

Starting electrically conductive powder used in this comparative example was the powder used in Example 5, namely, the substantially spherical silver-plated copper powder that had been obtained by plating starting copper powder having an average particle diameter of 5.5 μm with 15 wt % of silver. The tap density of the starting electrically conductive powder was 45%. The silver-plated copper powder was surface treated with 0.2 wt % of stearic acid, and 500 g of the treated powder was fed in a 2-L ball mill. The ball mill contained 1.2

TABLE 1

| | Average particle diameter μm | The diameter for which 30% of the total particles were finer | Aspect ratio of large particles | Aspect ratio of small particles | Tap density | Time to 5 mA (sec) | Volume resistivity value μΩ·cm | Thermal conductivity Wm$^{-1}$K$^{-1}$ |
|---|---|---|---|---|---|---|---|---|
| Ex. 1 | 6.0 | 2.5 | 2.3 | 7.3 | 64.1 | 57 | 14 | 46 |
| Ex. 2 | 6.9 | 2.3 | 3.4 | 8.7 | 63.2 | 53 | 13 | 48 |
| Ex. 3 | 11.3 | 3.7 | 2.5 | 10.7 | 63.6 | 59 | 13 | 45 |
| Ex. 4 | 10.1 | 3.1 | 2.6 | 13.2 | 63.1 | 62 | 12 | 47 |
| Ex. 5 | 6.4 | 2.4 | 2.3 | 5.7 | 63.7 | 468 | 14 | 43 |
| Ex. 6 | 6.7 | 2.8 | 1.9 | 7.1 | 63.4 | 386 | 16 | 46 |
| Ex. 7 | 7.6 | 3.3 | 2.9 | 8.7 | 60.2 | 497 | 15 | 40 |
| Ex. 8 | 7.2 | 3.1 | 2.6 | 8.7 | 62.1 | 631 | 16 | 38 |
| Ex. 9 | 7.3 | 2.9 | 3.6 | 11.2 | 60.1 | 459 | 16 | 38 |
| Ex. 10 | 6.6 | 2.6 | 3.2 | 10.3 | 60.3 | 575 | 14 | 40 |
| Ex. 11 | 6.5 | 3.4 | 4.2 | 13.1 | 61.4 | 540 | 12 | 35 |
| Ex. 12 | 7.1 | 3.0 | 4.7 | 11.3 | 60.7 | 650 | 11 | 35 |
| Ex. 13 | 6.8 | 2.5 | 4.7 | 13.5 | 60.5 | 729 | 11 | 39 |
| Ex. 14 | 7.1 | 3.2 | 5.1 | 11.8 | 60.3 | 768 | 13 | 48 |
| Ex. 15 | 11.2 | 7.8 | 2.6 | 5.6 | 62.7 | 590 | 11 | 43 |
| Ex. 16 | 11.5 | 7.2 | 2.3 | 12.2 | 61.9 | 631 | 13 | 39 |
| Ex. 17 | 13.6 | 7.9 | 4.0 | 13.1 | 60.3 | 673 | 11 | 34 |

Comparative Example 1

Starting electrically conductive powder used in this comparative example was the substantially spherical silver powder with an average particle diameter of 5.2 μm that was used in Example 1. The tap density of the starting electrically conductive powder was 53%. The silver powder was surface treated with 0.1 wt % of stearic acid, and 500 g of the treated liters of zirconia balls with a diameter of about 10 mm. The ball mill was rotated at a rotation speed of 50 min$^{-1}$ for 200 hours to treat the powder.

The resultant electrically conductive powder had an average particle diameter of 14.5 μm. The diameter for which 30% of the total particles were smaller was 4.3 μm. SEM observation showed that large particles had an average aspect ratio of 15.2, and small particles had an average aspect ratio of 29.6.

The tap density of the electrically conductive powder was 43.4%. The electrically conductive powder was stored in the atmosphere for 12 months, and the powder was colored to dark brown.

Thereafter, the electrically conductive powder was mixed with a binder in the same ratio as in Example 1. The mixture did not form a paste because of insufficiency of the binder.

Comparative Example 3

Starting electrically conductive powder used in this comparative example was the powder used in Example 5, namely, the substantially spherical silver-plated copper powder that had been obtained by plating starting copper powder having an average particle diameter of 5.5 µm with 15 wt % of silver. The starting electrically conductive powder was not treated and was directly mixed with a binder in the same ratio as in Example 1. The mixture did not form a paste because of insufficiency of the binder.

Separately, 87 g of the starting electrically conductive powder was mixed with 13 g of the binder described in Example 1 to give a paste. Comb electrodes were printed with the paste in the same manner as in Example 1. Anti-migration properties were tested by applying a direct current voltage of 30 V. As a result, the current flowing between the comb electrodes became 5 mA in 93 seconds.

Comparative Example 4

Starting electrically conductive powder used in this comparative example was the powder used in Example 8, namely, the substantially spherical silver-plated copper powder that had been obtained by plating starting copper powder having an average particle diameter of 5.5 µm with 30 wt % of silver. The starting electrically conductive powder was not treated and was directly mixed with a binder in the same ratio as in Example 1. The mixture did not form a paste because of insufficiency of the binder.

Separately, 87 g of the starting electrically conductive powder was mixed with 13 g of the binder described in Example 1 to give a paste. Comb electrodes were printed with the paste in the same manner as in Example 1. Anti-migration properties were tested by applying a direct current voltage of 30 V. As a result, the current flowing between the comb electrodes became 5 mA in 87 seconds.

Comparative Example 5

Starting electrically conductive powder used in this comparative example was the powder used in Example 16, namely, the substantially spherical silver-plated copper powder that had been obtained by plating starting copper powder having an average particle diameter of 10.7 µm with 10 wt % of silver. The starting electrically conductive powder was not treated and was directly mixed with a binder in the same ratio as in Example 1. The mixture did not form a paste because of insufficiency of the binder.

Separately, 87 g of the starting electrically conductive powder was mixed with 13 g of the binder described in Example 1 to give a paste. Comb electrodes were printed with the paste in the same manner as in Example 1. Anti-migration properties were tested by applying a direct current voltage of 30 V. As a result, the current flowing between the comb electrodes became 5 mA in 89 seconds.

Example 18

350 g of the electrically conductive powder obtained in Example 15 and 150 g of easily-dispersible fine silver particles having an average particle diameter of 1.6 µm and a tap density of 57.7% were fed in a 2-L V blender, and they were mixed together for 0.5 hour. As a result, electrically conductive powder was prepared. Thereafter, 93 g of the electrically conductive powder and 7 g of the binder described in Example 1 were mixed together to form a paste. The paste was applied to print a circuit having a line length of 115 mm and a linewidth of 0.8 mm. The paste was dried and solidified at 185° C. for 30 minutes. The circuit had a volume resistivity value of 9 µΩ·cm. Separately, the paste was repeatedly spread and dried carefully not to incorporate voids. The thus-printed laminate was dried to give a test piece having a thickness of 1.3 mm. The test piece had a thermal conductivity of 87 $Wm^{-1}K^{-1}$. The test piece was tested for solder wettability in the same manner as in Example 5. The solder was not released when the test piece was slit into pieces with 0.5 mm width. This result proved high wettability of the test piece with solder.

Example 19

400 g of the electrically conductive powder obtained in Example 5 and 100 g of easily-dispersible fine silver particles having an average particle diameter of 1.6 µm and a tap density of 57.7% were fed in a 2-L V blender, and they were mixed together for 0.5 hour. As a result, electrically conductive powder was prepared. Thereafter, 94 g of the electrically conductive powder and 6 g of the binder described in Example 1 were mixed together to form a paste. The paste was applied to print a circuit having a line length of 115 mm and a linewidth of 0.8 mm. The paste was dried and solidified at 185° C. for 30 minutes. The circuit had a volume resistivity value of 9 µΩ·cm.

Comb electrodes were printed with the paste in the same manner as in Example 1. Anti-migration properties were tested by applying a direct current voltage of 30 V. As a result, the current flowing between the comb electrodes became 5 mA in 352 seconds. Separately, the paste was repeatedly spread and dried carefully not to incorporate voids. The thus-printed laminate was dried to give a test piece having a thickness of 1.3 mm. The test piece had a thermal conductivity of 72 $Wm^{-1}K^{-1}$.

Example 20

300 g of the electrically conductive powder obtained in Example 14 and 200 g of easily-dispersible fine silver particles having an average particle diameter of 1.4 µm and a tap density of 59.3% were fed in a 2-L ball mill, and they were mixed together by rotating the ball mill without balls at a rotation speed of 40 $min^{-1}$ for 0.5 hour. As a result, electrically conductive powder was prepared. Thereafter, 94 g of the electrically conductive powder and 6 g of the binder described in Example 1 were mixed together to form a paste. The paste was applied to print a circuit having a line length of 115 mm and a linewidth of 0.8 mm. The paste was dried and solidified at 185° C. for 30 minutes. The circuit had a volume resistivity value of 8 µΩ·cm.

Comb electrodes were printed with the paste in the same manner as in Example 1. Anti-migration properties were tested by applying a direct current voltage of 30 V. As a result, the current flowing between the comb electrodes became 5 mA in 348 seconds. Separately, the paste was repeatedly spread and dried carefully not to incorporate voids. The thus-printed laminate was dried to give a test piece having a thickness of 1.3 mm. The test piece had a thermal conductivity of 74 $Wm^{-1}K^{-1}$.

Example 21

291 g of the electrically conductive powder obtained in Example 3, 194 g of easily-dispersible fine silver particles having an average particle diameter of 1.4 μm and a tap density of 59.3%, and 15 g of agglomerated ultra fine silver particles having a primary particle diameter of 0.06 μm and a tap density of 18% were fed in a 2-L ball mill, and they were mixed together by rotating the ball mill without balls at a rotation speed of 40 min$^{-1}$ for 50 hours. As a result, electrically conductive powder was prepared. The electrically conductive powder had a tap density of 74.3%. Thereafter, 94.5 g of the electrically conductive powder and 5.5 g of the binder described in Example 1 were mixed together to form a paste. The paste was applied to print a circuit having a line length of 115 mm and a linewidth of 0.8 mm. The paste was dried and solidified at 185° C. for 30 minutes. The circuit had a volume resistivity value of 6.5 μΩ·cm.

Separately, a thermal conductivity test piece was prepared with the paste in the same manner as in Example 1. The test piece was found to have a thermal conductivity of 59 Wm$^{-1}$K$^{-1}$.

Separately, the paste was applied and dried at 80° C. for 60 minutes carefully not to incorporate voids. A layer of the paste was printed on the first paste layer and was dried. The printing and drying were repeated to prepare a semi-cured product having a thickness of 2 mm. The semi-cured product was held at 80° C. for 2 hours while being pressed at 2 MPa. The pressure was reduced to 1 MPa, and the temperature was increased to 165° C. in 3 hours. The product was held at the pressure and 165° C. for 1 hour and was thereby cured. The resultant test piece had a thermal conductivity of 104 Wm$^{-1}$K$^{-1}$.

Example 22

In a three roll mill container, 2.84 g of the agglomerated ultra fine silver particles used in Example 21 were fed with 5.5 g of the binder composition described in Example 21. They were mixed together for 30 minutes by a three roll mill. Subsequently, 36.67 g of the easily-dispersible fine silver particles described in Example 21 were fed to the mixture, and they were mixed together by the three roll mill for 1 hour. Thereafter, 55 g of the electrically conductive powder described in Example 21 was fed, and the mixture was mixed for 10 minutes to give a paste.

The paste was applied to print a circuit having a line length of 115 mm and a linewidth of 0.8 mm. The paste was dried and solidified at 185° C. for 30 minutes. The circuit had a volume resistivity value of 6.2 μΩ·cm. Separately, a thermal conductivity test piece was prepared with the paste in the same manner as in Example 1. The test piece was found to have a thermal conductivity of 62 Wm$^{-1}$K$^{-1}$.

Example 23

700 g of substantially disagglomerated flakey silver particles having a tap density of 64% and an average particle diameter of 11 μm, and 300 g of easily-dispersible fine silver particles having a tap density of 55% and an average particle diameter of 1.5 μm were fed in A 2-L ball mill containing no balls. They were uniformly mixed together by rotating the ball mill at a rotation speed of 40 min$^{-1}$ for 0.5 hour. The press density of the resulting electrically conductive powder was 94%.

The electrically conductive powder was mixed with a 25 wt % solution of a phenoxy resin binder having a softening point of 195° C., in ratios described in Table 2. Pastes of electrically conductive powder were thus prepared. Each of the electrically conductive paste was applied to print a circuit in the same manner as described in the above examples. The printed circuits were dried at 110° C. for 45 minutes. Electric conductivities of the circuits were evaluated based on the volume resistivity value. The results are shown in Table 2.

TABLE 2

Compositions of electrically conductive powder pastes and electric conductivities

| No. | Amount of electrically conductive powder | Solid binder amount | Volume resistivity value (μΩcm) |
|---|---|---|---|
| 101 | 96.0 | 4.0 | 9.7 |
| 102 | 97.0 | 3.0 | 8.5 |
| 103 | 98.0 | 2.0 | 7.2 |
| 104 | 98.5 | 1.5 | 4.6 |
| 105 | 99.0 | 1.0 | 6.4 |

The amount of the electrically conductive powder and the solid binder amount are expressed in parts by weight. The solid binder amount is a solid content in the phenoxy resin solution used as the binder.

As shown in Table 2, the pastes of the electrically conductive powder and the thermoplastic binder had excellent volume resistivity values ranging from 4.6 to 9.7 μΩcm, with the amounts of the electrically conductive powder ranging from 96 to 99%.

The invention claimed is:

1. Electrically conductive powder which is substantially disagglomerated electrical conductive powder, comprising polyhedral particles and flake particles, wherein at least 91% of the particles are disagglomerated, wherein small particles being less in size than a particle size for which 30% of the total particles are smaller have an average aspect ratio of not less than 3, the upper limit of the average aspect ratio of the small particles being not more than 20, the average aspect ratio of the small particles is at least 1.3 times greater than that of large particles being not less in size than the particle size for which 30% of the total particles are smaller, the average aspect ratio of the large particles being from 1 to 6, the substantially disagglomerated electrically conductive powder is surface treated with not more than 0.5 wt % of a fatty acid based on the weight of the electrically conductive powder, the electrically conductive powder further comprises easily-dispersible fine silver particles that have an average primary particle diameter of not more than 2.5 μm and a relative tap density of not less than 45%, and the weight ratio of the electrically conductive powder and the easily-dispersible fine silver particles is in the range of 95:5 to 55:45.

2. The electrically conductive powder according to claim 1, wherein the electrically conductive powder further comprises agglomerated ultra fine silver particles, the ultra fine silver particles in the agglomerated particles have an average primary particle diameter of not more than 0.3 μm, and the weight ratio of the electrically conductive powder, the easily-dispersible fine silver particles and the ultra fine silver particles is in the range of 94.525:4.975:0.5 to 52.25:42.75:5.00.

3. The electrically conductive powder according to claim 1, wherein the substantially disagglomerated electrically conductive powder comprises silver or a silver alloy, or copper or a copper alloy coated with silver, and when the substantially disagglomerated electrically conductive powder comprises copper or a copper alloy coated with silver, the weight ratio of copper and silver (copper:silver) is in the range of 95:5 to 65:35.

4. The electrically conductive powder according to claim 1, wherein a press density of the electrically conductive powder is in the range of 80 to 99%.

5. A paste of electrically conductive powder comprising the electrically conductive powder of claim 1 and a binder, wherein the binder content is in the range of 0.3 to 7 wt % of the total weight of a solid in the binder and the electrically conductive powder.

6. A process for producing the electrically conductive powder of claim 1, comprising placing starting electrically conductive powder and fine beads into a container, and allowing the starting electrically conductive powder and the beads to flow by moving the container to disagglomerate and shape-transform the starting electrically conductive powder into polyhedral particles and flake particles.

7. The process according to claim 6, wherein the starting electrically conductive powder comprises silver or a silver alloy.

8. A process for producing a paste of electrically conductive powder, comprising dispersing agglomerated ultra fine silver particles and easily-dispersible fine silver particles in a binder solution to prepare a slurry, applying shear force to the slurry to disagglomerate the agglomerated ultra fine silver particles and the easily-dispersible fine silver particles, and uniformly admixing the electrically conductive powder of claim 1.

9. The electrically conductive powder according to claim 2, wherein a press density of the electrically conductive powder is in the range of 80 to 99%.

10. The electrically conductive powder according to claim 3, wherein a press density of the electrically conductive powder is in the range of 80 to 99%.

11. A paste of electrically conductive powder comprising the electrically conductive powder of claim 2 and a binder, wherein the binder content is in the range of 0.3 to 7 wt % of the total weight of a solid in the binder and the electrically conductive powder.

12. A paste of electrically conductive powder comprising the electrically conductive powder of claim 3 and a binder, wherein the binder content is in the range of 0.3 to 7 wt % of the total weight of a solid in the binder and the electrically conductive powder.

13. A paste of electrically conductive powder comprising the electrically conductive powder of claim 4 and a binder, wherein the binder content is in the range of 0.3 to 7 wt % of the total weight of a solid in the binder and the electrically conductive powder.

14. The electrically conductive powder according to claim 1, wherein the polyhedral particles are selected from the group consisting of polyhedra having many fine planes, polyhedra with planar planes and curved surfaces, and polyhedra similar to cubes and rectangular parallelepipeds.

* * * * *